United States Patent [19]

Reitmeyer, Jr.

[11] 3,720,879

[45] March 13, 1973

[54] LOW-CAPACITY, HIGH IMPEDANCE CIRCUIT

[75] Inventor: Randolph A. Reitmeyer, Jr., Oakhurst, N.J.

[73] Assignee: The United States of America as represented by the Secretary of the Army

[22] Filed: April 17, 1972

[21] Appl. No.: 244,686

[52] U.S. Cl. ........................330/26, 330/27, 330/32, 330/35

[51] Int. Cl. ................................................H03f 3/16

[58] Field of Search..........330/26, 27, 35, 70, 76, 78, 330/32

[56] References Cited

UNITED STATES PATENTS 2,795,654 6/1957 MacDonald ............................330/70

*Primary Examiner*—Roy Lake

*Assistant Examiner*—James B. Mullins

*Attorney*—Harry M. Saragovitz et al.

[57] ABSTRACT

This invention relates to amplifiers and particularly to low-input-capacitance, high-input-impedance amplifiers. More particularly, this invention relates to an amplifier using a dual-gate, field-effect transistor with circuitry for increasing the effective input impedance and reducing the effective input capacitance of the dual-gate field-effect transistor to an extremely low value.

3 Claims, 2 Drawing Figures

PATENTED MAR 13 1973

3,720,879

LOW-CAPACITY, HIGH IMPEDANCE CIRCUIT

BACKGROUND OF THE INVENTION

There are applications in the field of biomedical research that require high-input-impedance, alternating-current-coupled amplifiers that can operate down to very low frequencies. In some of these applications, bioelectric and electrocardiographic signals are obtained with coupling through large area electrodes, with coupling capacities ranging from hundreds to thousands of picrofarads. These present few problems. However, in others of these applications — for example in nerve-stimulus response measurements — signals must be obtained from couplings that permit only very small electrodes, and hence, have extremely-small input coupling capacities. These low-capacity probes cannot be used with conventional input systems since they would require circuits with input capacities very much lower, as well as input impedances very much higher, than those that are normally available.

The standard, single-gate field-effect transistor has relatively-high input impedance, and moderate input capacitance characteristics, and alternating-current amplifiers are available that utilize these characteristics. However, in certain applications, the effective input impedance of a field-effect-transistor, a-c amplifier (which includes a relatively low value input bias resistor) is too low and its input capacity is too high. To improve the input characteristics of the single-gate field-effect transistor amplifier, one can use feedback techniques. These techniques require fairly complex circuitry and additional amplifiers, etc. to accomplish a reduction in capacity as well as an increase in input impedance. Such additional, complex circuitry requires more space and has more current drain.

The dual-gate, MOS field-effect transistor was developed for higher frequencies and is used mainly for amplifiers and mixers that require a second control electrode. In its normal connection, the input is to the first gate. The second gate is usually biased, but it is normally grounded for a-c purposes. The dual-gate, MOS field-effect transistor has impedance, and capacitance, input characteristics, comparable to those of the single gate, but the input capacity is still limited by the interelectrode capacities that are effectively across the input. Specifically, these are the first gate to source capacity, the intergate capacity, and the second gate to drain capacity. The gate to source capacity of a field-effect transistor can be effectively reduced by using a source follower configuration with a high-impedance load in the source circuit, but the remaining intergate and second-gate-to-drain capacities still limit the effectiveness of the circuit in situations where an extremely low input capacity is essential.

SUMMARY OF THE INVENTION

The subject invention effectively reduces the effects of the various interelectrode capacitances by using a dual-gate, field-effect transistor with a source of input signals connected to the first gate, which is adjacent to the source electrode. Unity gain of the transistor is approached and the effective capacity between the first gate and source is reduced by the source follower action of a constant-current-connected transistor between the source electrode and a negative voltage terminal. The effects of the intergate capacity and the second-gate-to-drain capacity are reduced by capacitive feedback between the source to the second gate. The source is also connected, through a capacitor, to the junction of series-connected resistors supplying the bias for the first gate, to substantially increase the effective input impedance. The capacity between an external shield of the circuit and the input wiring is reduced by connecting the shield to the output terminal which is also connected to the source electrode.

DETAILED DESCRIPTION OF THE PREFERRED EMBODIMENT

Figure 1:
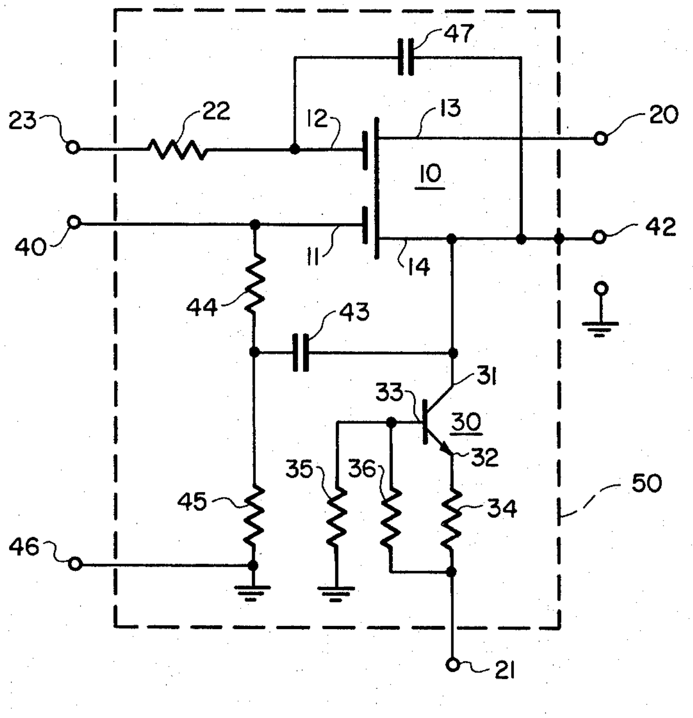
FIG. 1 illustrates a circuit diagram of a typical embodiment of this invention.

Referring now more particularly to FIG. 1, a dual-gate, MOS field-effect transistor 10 has a first gate electrode 11, a second gate electrode 12, a drain electrode 13 and a source electrode 14. The drain electrode is connected to a positive voltage terminal 20 and the source electrode is connected through a transistor 30 and a resistor 34 to a negative voltage terminal 21. The source electrode is also connected to an output terminal 42; to a shield 50; through capacitor 47 to the second gate electrode 12 and through a capacitor 43 to the junction of series-connected biasing resistors 44 and 45. An input terminal 40 is connected to the first gate 11 of the field-effect transistor. The resistor 44 connects to the first gate electrode and the resistor 45 is grounded at 46. The second gate electrode 12 is connected through a resistor 22 to a source of bias voltage 23.

The transistor 30 has a collector electrode 31 connected to the source electrode 14 of the field-effect transistor 10; an emitter electrode 32 connected through the resistor 34 to the negative voltage terminal 21; and a base electrode 33 connected through a resistor 35 to ground, and through a resistor 36 to the negative voltage terminal 21.

Figure 2:
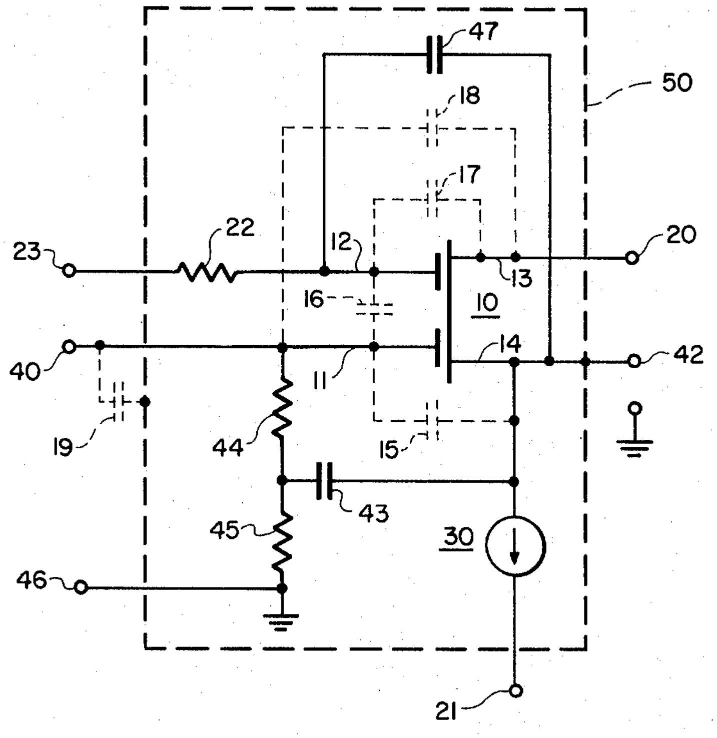
FIG. 2 is a circuit diagram showing the effective interelectrode capacitances of the field effect transistor.

The function of this circuit will be better understood by referring to FIG. 2 which shows the field-effect transistor 10, with its various electrodes, similar to those in FIG. 1 and similarly numbered. FIG. 2 also represents some of the interelectrode capacitances in dotted lines. A capacity 15 is between the first gate 11 and the source 14; a capacity 16 is between the first and second gates; a capacity 17 is between the second gate 12 and the drain electrode 13. A capacity 18 is between the first gate 11 and the drain 13; and a capacity 19 is between the input 40 and the shield 50. The other elements of the circuit that have their equivalent, in FIG. 1 are similarly numbered. Other elements that are not essential to the description of the operation are omitted.

In operation, an input signal applied to the first gate electrode 11 draws the source electrode 14 in the same direction through the source follower action of the field-effect transistor. The constant-current-connected transistor 30, which is set to the operating current of the field-effect transistor, has the effect of a very-high source load resistance and permits the source to follow the variations of the input signal and to maintain substantially the same potential between the first gate and source electrodes that comprise the interelectrode capacity 15. This reduces the effective capacity 15 and its contribution to the amplifier's input capacity to a negligible amount.

The output of the source follower can be applied to a suitable, high-impedance load between the output terminal 42 and ground to provide unity gain in a well known manner. This output is also applied, through the capacity 47, to the second gate electrode 12. This applies a signal, on the second gate, of substantially the same phase and magnitude as that applied to the first gate. This maintains substantially the same potential between the first and second gate electrodes that comprise the interelectrode capacity 16. This reduces the effective capacity 16 and its contribution to the amplifier's input capacity to a negligible amount.

The output of the source follower is also connected to the shield 50 to apply a signal on the shield of substantially the same phase and magnitude as the signal on the input conductor at 40. This maintains substantially the same potential between the input conductor and the shield that comprises capacitor 19, which reduces the effective capacity between the shield and the input to a negligible amount.

If the effects of 15, 16 and 19 have been reduced to negligible amounts by these techniques; the capacity of 18 is minimal in a dual-gate field-effect transistor; and the effect of 17 is limited by its series combination with 16; the input capacitance of this circuit becomes minimal.

The output of the source follower is also connected to the junction of resistors 44 and 45. This applies a signal, to the biasing resistor 44, of the first gate electrode 11, that is of substantially the same phase and magnitude as the input signal. This makes the effective input resistance very much higher than the actual value of the resistor 44, which is already higher than the normal, first-gate, bias resistor of a field effect transistor.

The bias of the second gate electrode 12 is established by the voltage terminal 23 through the decoupling resistor 22. This voltage will be in the normal range for a second gate of a dual-gate, MOS field-effect transistor.

In a typical embodiment of this invention, the transistor 10 is a 3N140 type made by RCA. The transistor 30 is a 2N1893 made by Motorola. The voltage supply 20 is +10 volts; 21 is −15 volts; and 23 is +12 volts; all with respect to ground. The resistor 22 is 12 megohms; the resistors 34, 35 and 36 are 680,2700 and 820 ohms respectively; and the resistors 44 and 45 are 1000 megohms and 12 megohms respectively. The capacitors 43 and 47 are both 47 microfarads.

The input capacity at the first gate of a dual-gate, field-effect transistor would normally be 5.5 picofarads. The capacities 15, 16, 17 and 19 would normally be in the range of 1–10 picofarads and capacity 18 would normally be 0.02 picofarads. The input resistance of a dual-gate, field-effect transistor in an a-c amplifier is limited by the bias resistor and is normally in the range of from 1–10 megohms. The effective input capacity of this circuit is reduced from about 5.5 to about 0.05 picofarads. The effective input impedance of this circuit is increased to about 800,000 megohms.

It is to be understood that we do not desire to be limited to the exact details of construction shown and described, for obvious modifications will occur to a person skilled in the art.

What is claimed is:

1. In combination with a dual-gate field-effect transistor having source, drain, first gate, and second gate electrodes, a source of positive voltage with respect to ground connected to said drain electrode; a constant-current load impedance connected between a source of negative voltage with respect to ground and said source electrode; first and second biasing resistors connected in series between said first gate electrode and ground; a shield for said circuit; means for connecting a source of input signal to said first gate electrode; means for connecting an output terminal to said source electrode; means for connecting a source of positive bias voltage to said second gate electrode; means for applying in-phase feedback from said source electrode to said second gate, to reduce the effective capacity between said first and second gate electrodes; means for applying in phase feedback from said source electrode to the junction of said first and second resistors, to increase the effective input resistance of said first gate electrode; and means for applying in-phase feedback from said source electrode to said shield, to reduce the effective capacity between said shield and said means for connecting a source of input signals to said first gate electrode.

2. A dual-gate field-effect transistor as in claim 1 wherein said constant-current load impedance comprises a second transistor having emitter, collector, and base electrodes; a third resistor connected in series with said emitter and collector electrodes of said second transistor between said source electrode and said source of negative voltage; a fourth resistor connected between said base electrode and said source of negative voltage and a fifth resistor connected between said base electrode and ground.

3. A dual-gate field-effect transistor as in claim 1 wherein said means for applying a feedback from said source electrode to said second gate electrode comprises a first capacitor and said means for connecting said source electrode to the junction of said first and second resistors comprises a second capacitor.

* * * * *